United States Patent
Kim

(10) Patent No.: US 7,629,748 B2
(45) Date of Patent: Dec. 8, 2009

(54) PLASMA DISPLAY APPARATUS

(75) Inventor: Sok-San Kim, Cheonan-si (KR)

(73) Assignee: Samsung SDI Co., Ltd., Suwon (KR)

( * ) Notice: Subject to any disclaimer, the term of this patent is extended or adjusted under 35 U.S.C. 154(b) by 678 days.

(21) Appl. No.: 11/036,046

(22) Filed: Jan. 18, 2005

(65) Prior Publication Data

US 2005/0184631 A1    Aug. 25, 2005

(30) Foreign Application Priority Data

Feb. 19, 2004    (KR) .................... 10-2004-0011000

(51) Int. Cl.
*H01J 17/49* (2006.01)
(52) U.S. Cl. ...................... 313/586; 313/582
(58) Field of Classification Search ......... 313/582–587; 315/169.4; 345/37, 41, 60
See application file for complete search history.

(56) References Cited

U.S. PATENT DOCUMENTS

| | | | | |
|---|---|---|---|---|
| 5,971,566 | A * | 10/1999 | Tani et al. ............... | 362/294 |
| 6,288,489 | B1 * | 9/2001 | Isohata et al. ........... | 313/582 |
| 6,445,373 | B1 * | 9/2002 | Yamamoto ............... | 345/102 |
| 6,633,126 | B1 * | 10/2003 | Tsai et al. ............... | 313/582 |
| 2001/0005308 | A1 * | 6/2001 | Oishi et al. .............. | 361/687 |
| 2002/0051102 | A1 * | 5/2002 | Kuroki et al. ............ | 349/58 |
| 2003/0025427 | A1 * | 2/2003 | Kim et al. ................ | 313/46 |
| 2004/0141101 | A1 * | 7/2004 | Osu et al. ................ | 349/58 |
| 2004/0195969 | A1 * | 10/2004 | Kim et al. ................ | 313/583 |
| 2005/0093429 | A1 * | 5/2005 | Ahn et al. ............... | 313/498 |

FOREIGN PATENT DOCUMENTS

| | | |
|---|---|---|
| CN | 1108623 | 5/2003 |
| EP | 1383356 | 1/2004 |
| JP | 1997-330663 | 12/1997 |
| JP | 11-119678 | 4/1999 |
| JP | 11-272182 | 10/1999 |
| JP | 2003-162228 | 6/2003 |

OTHER PUBLICATIONS

Chinese Office Action dated Oct. 10, 2008.

* cited by examiner

*Primary Examiner*—Mariceli Santiago
*Assistant Examiner*—Christopher M Raabe
(74) *Attorney, Agent, or Firm*—H.C. Park & Associates, PLC

(57) ABSTRACT

A plasma display apparatus including a panel displaying an image, a chassis base coupled to a rear surface of the panel, and a camber suppression member installed between the panel and the chassis base to prevent the panel from being cambered.

12 Claims, 8 Drawing Sheets

FRONT ←——→ REAR

FRONT ← → REAR

PLASMA DISPLAY APPARATUS

CROSS REFERENCE TO RELATED APPLICATION

This application claims priority to and the benefit of Korean Patent Application No. 10-2004-0011000, filed on Feb. 19, 2004, which is hereby incorporated by reference for all purposes as if fully set forth herein.

BACKGROUND OF THE INVENTION

1. Field of the Invention

The present invention relates to a plasma display apparatus, and more particularly, to a plasma display apparatus having an improved structure that may prevent panel damage due to cambering.

2. Discussion of the Background

Generally, a plasma display apparatus is a flat panel display apparatus that realizes images generated via a gas discharge. The plasma display apparatus may be less than a few centimeters thick, and it may have a wide screen and a wide viewing angle of 150° or more. Hence, they are considered to be next generation display apparatuses.

The plasma display apparatus may be manufactured by forming and assembling front and rear panels, attaching a chassis base on a rear portion of the coupled panel, packaging a circuit board on the chassis base, and housing the panel in a case. Japanese Laid-open Patent Publication No. 2003-162228 discloses an example of a plasma display apparatus.

The chassis base supports the panel and emits heat transmitted from it, and reinforcing members, which help support the panel, may be added to the chassis base.

However, the panel may generate a lot of heat, and if thermal expansion coefficients of the panel, the chassis base, and the reinforcing member differ from each other, the panel may warp.

FIG. 1 shows an example of a cambered panel.

Referring to FIG. 1, a heat radiation member 14 may be interposed between the panel 11 and the chassis base 12, which may be attached to the panel with dual adhesive tape. A reinforcing member 13 may be attached to the chassis base 12. In this case, the panel 11 has a convex front surface and a concave rear surface. The above transformation may be generated when the thermal expansion coefficient of the panel 11 is greater than that of the chassis base 12. When the thermal expansion degree of the panel 11 is greater than that of the chassis base 12, the front portion of the panel 11 may be bent to be convex.

FIG. 2 shows another example of a cambered panel.

Referring to FIG. 2, a heat radiation member 24 may be interposed between the panel 21 and a chassis base 22, which may be attached to the panel with dual adhesive tape. A reinforcing member 23 coupled to the chassis base 22. In this case, the panel 21 has a concave front surface and a convex rear surface. The above transformation may be generated when the thermal expansion coefficient of the chassis base 22 is greater than that of the panel 21, particularly when the heat radiation member 24 is relatively thin. When the thermal expansion degree of the chassis base 22 is greater than that of the panel 21, the panel 21 may have a convex rear surface.

Excessive panel camber may separate the panel and the chassis base from each other, thereby decreasing the chassis base's heat radiation and support functions. Moreover, an excessive stress may be applied to the panel, which may crack the substrate and a barrier rib formed therein. These problems may magnify as panel size increases.

SUMMARY OF THE INVENTION

The present invention provides a plasma display apparatus that may be capable of preventing panel cambering, thereby preventing panel damage and separation of the panel and chassis base.

Additional features of the invention will be set forth in the description which follows, and in part will be apparent from the description, or may be learned by practice of the invention.

The present invention discloses a plasma display apparatus including a panel displaying an image, a chassis base coupled to the panel, and a camber suppression member between the panel and the chassis base to prevent the panel from being cambered.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
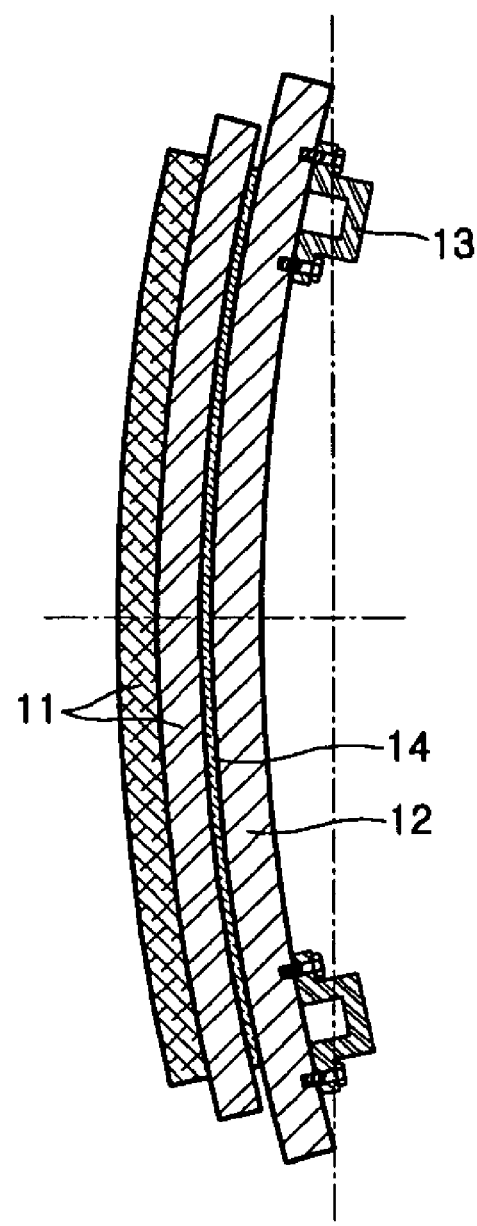
FIG. 1 is a cross-sectional view showing an example of panel cambering in a conventional plasma display apparatus.
Figure 2:
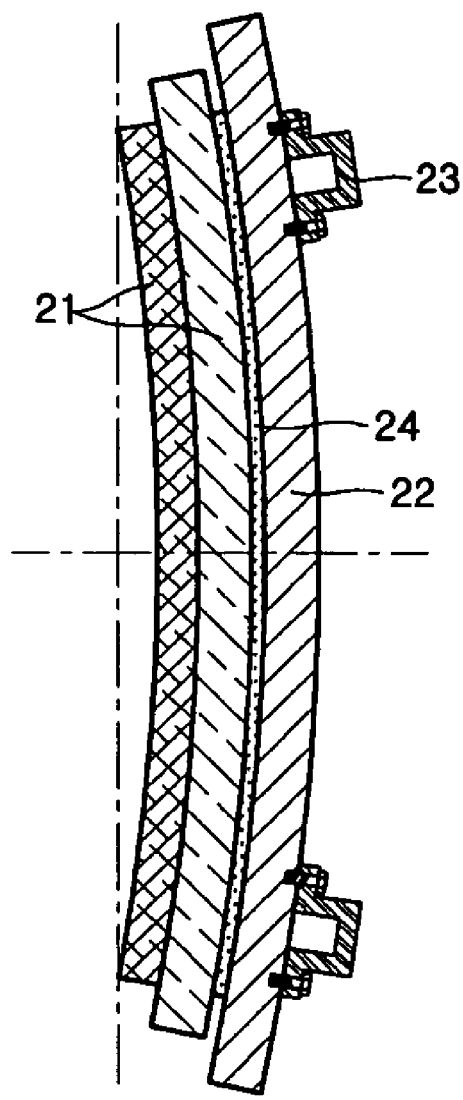
FIG. 2 is a cross-sectional view showing another example of panel cambering in the conventional plasma display apparatus.
Figure 3:
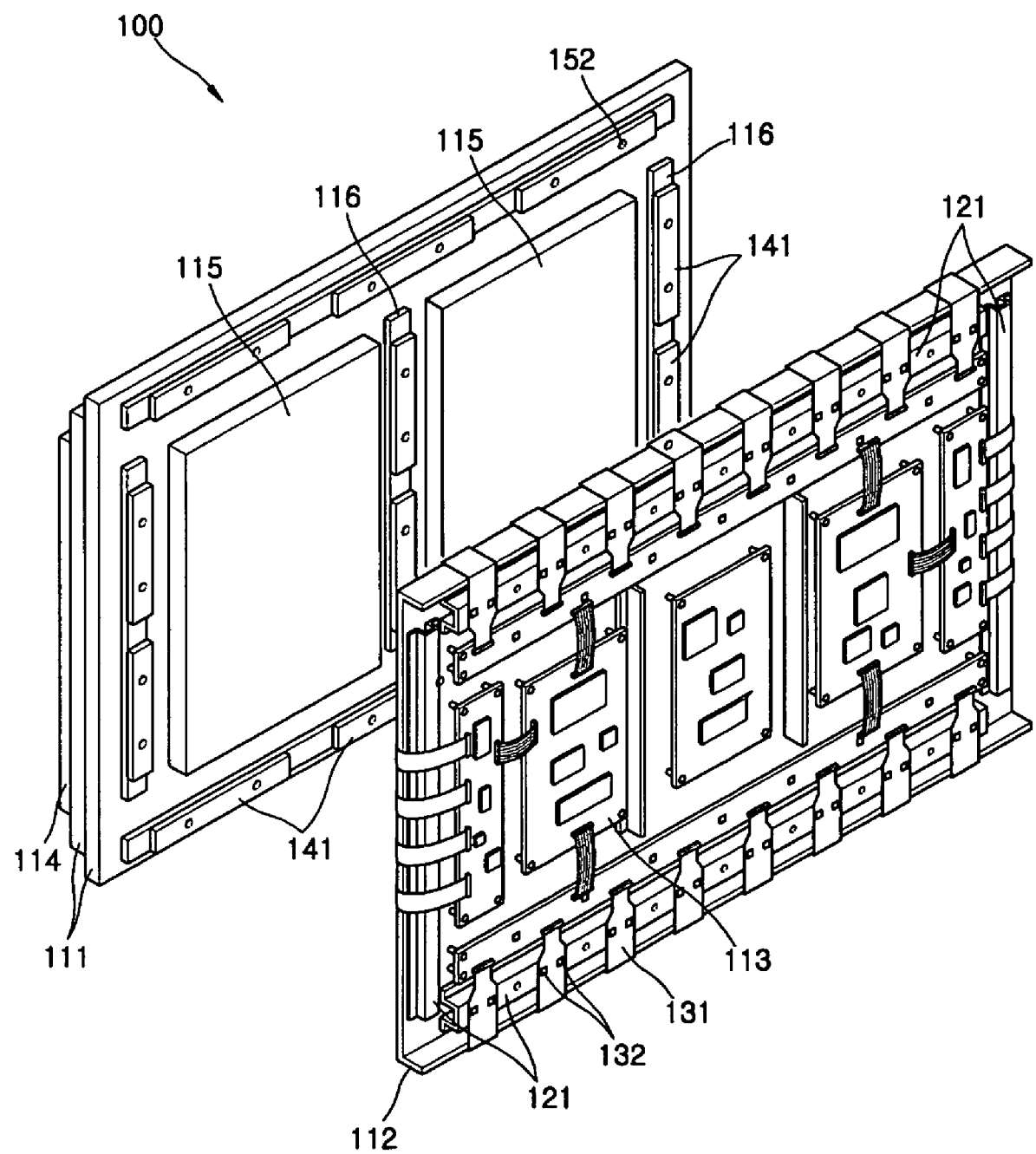
FIG. 3 is an exploded perspective view showing a plasma display apparatus according to a first exemplary embodiment of the present invention.
Figure 4:
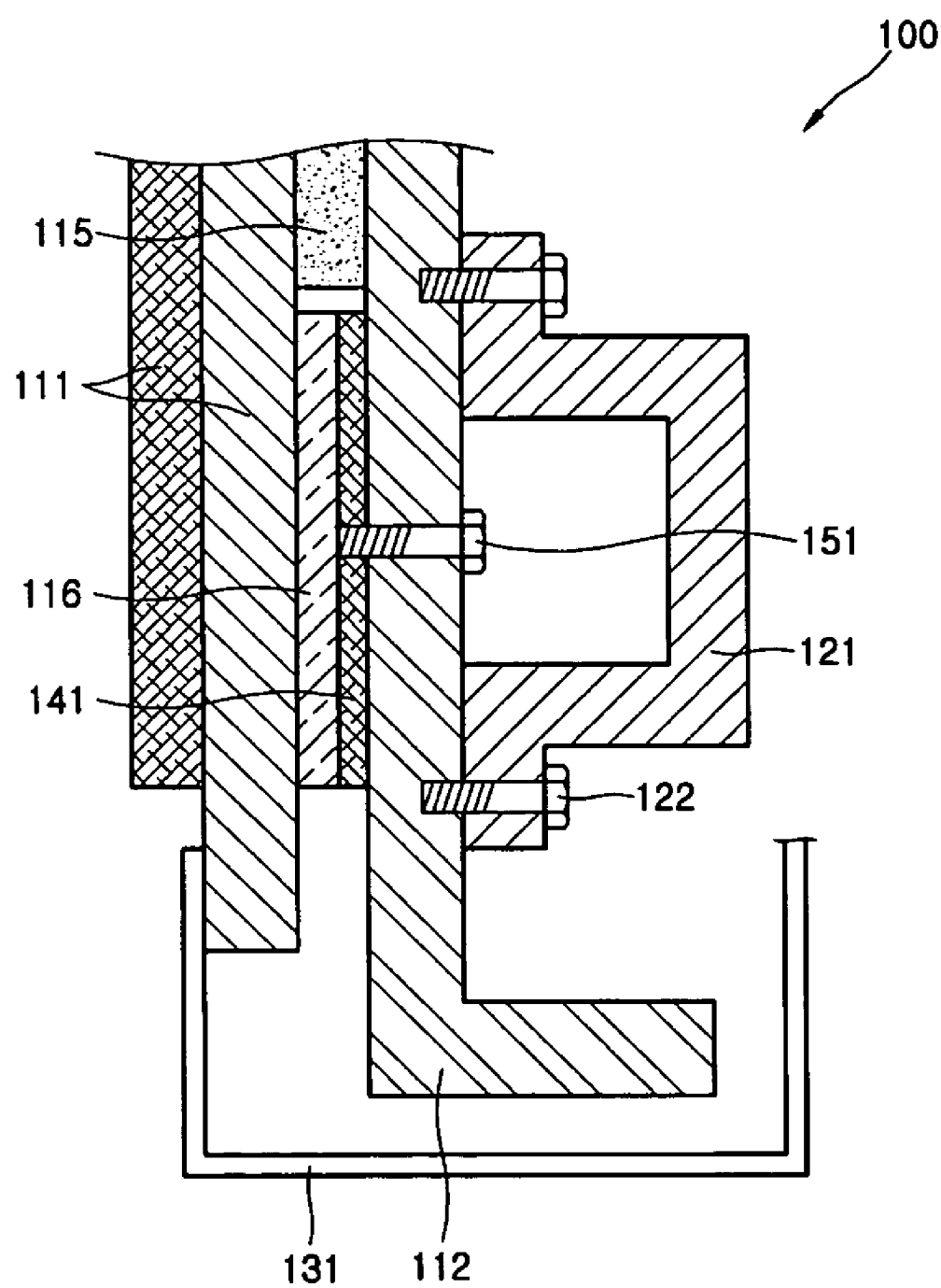
FIG. 4 is a cross-sectional view showing a part of the apparatus shown in FIG. 3.

FIG. 3 is an exploded perspective view showing a plasma display apparatus according to a first exemplary embodiment of the present invention, and a FIG. 4 is a cross-sectional view showing a part of the plasma display apparatus of FIG. 3.

Referring to FIG. 3 and FIG. 4, a plasma display apparatus 100 according to the first exemplary embodiment of the present invention may include a panel 111, a chassis base 112 supporting the panel 111, and a circuit board 113 disposed on rear portion of the chassis base 112.

The panel 111 includes front and rear panels. The front panel may include a plurality of sustain electrodes, a front dielectric layer covering the sustain electrodes, and a protecting layer covering the front dielectric layer.

The rear panel is sealed with the front panel while facing the front panel, and it may include a plurality of address electrodes crossing the sustain electrodes, a rear dielectric layer covering the address electrodes, barrier ribs formed on the rear dielectric layer, and red, green, and blue fluorescent layers formed on rear dielectric layer and sides of the barrier ribs.

A filter 114 may be installed on the front surface of the panel 111 to shield harmful electromagnetic waves that may be generated when driving the panel 111.

Additionally, the chassis base 112, which may be formed of a metal such as aluminum, may be coupled to a rear portion of the panel 111. The chassis base 112 supports the panel 111 and receives and emits heat from it.

The panel 111 may be coupled to the chassis base 112 by an adhesive, such as a dual adhesive tape, and a panel heat radiation unit 115, (i.e. a heat conductive medium), may be disposed between the panel 111 and the chassis base 112. The panel heat radiation unit 115 emits heat generated by the panel 111 to the outside of the panel via the chassis base 112.

Additionally, electric elements that drive the panel 111 may be mounted on the circuit board 113 that is installed on a rear portion of the chassis base 112. The circuit elements may include elements for supplying electric power to the panel 111 and elements for applying signals to the panel 111 to form images thereon. The panel 111, the chassis base 112, and the circuit board 113 may be housed in a case (not shown).

The circuit board 113 may transmit a driving signal to the panel 111 using a signal transport unit.

A tape carrier package (TCP) or a chip on film (COF) may be used as the signal transport unit. FIG. 3 shows a TCP 131 including at least one device 132, such as a driving integrated circuit (IC), on a tape.

As shown in FIG. 3, a plurality of TCPs 131 may be arranged in rows along edges of the chassis base 112. The TCP 131, which may pass around the end portion of the chassis base 112, couples the panel 111 to the circuit board 113. The mounted devices 132 may be arranged on reinforcing members 121, which may be coupled to the chassis base 112 with a screw 122.

Each device 132 that is mounted on the reinforcing member 121 may include heat radiation units (not shown) on both sides thereof, to emit heat generated during its operation. A liquid or gel-type thermal conductive medium, such as grease, or a heat radiation member of a plate type, may be used for the device's heat radiation unit. Additionally, a protecting plate (not shown) may cover and protect the outer side of the TCPs 131. The protecting plate may be made of a metal, and it may be coupled to the reinforcing member 121.

A camber suppression member 141 may be installed between the panel 111 and the chassis base 112.

The camber suppression member 141, which may prevent panel damage due to excessive camber, may be formed as a plate that is divided into a plurality of pieces. The divided pieces of the camber suppression member 141 may be disposed along the edges of the panel 111 in the longitudinal and transverse directions. The camber suppression member 141 may also be disposed on a center portion of the panel 111 in the longitudinal direction.

The structure and location of the camber suppression member are not limited to the above description. For example, additional camber suppression members may be disposed on the center portion in the longitudinal or transverse direction, or in both directions. Also, a longitudinally arranged camber suppression member and a transversely arranged camber suppression member may be continuously, independently formed as single unit, or they may be joined together.

The camber suppression members 141 may be attached to dual adhesive tape 116, which is attached to the panel 111, and coupled to the chassis base 112 using a coupling unit.

For example, screws 151 may be inserted into screw recesses 152 to form the coupling unit. In this case, the panel 111 and the chassis base 112 may be easily separated by removing the screws 151.

Appropriately setting the thermal expansion coefficient of the camber suppression member 141 according to the thermal expansion coefficient of the chassis base 112 may prevent excessive panel camber. Therefore, the camber suppression member 141 may be formed of an aluminum alloy including a tin or a zinc, or a polymer material including glass fiber or carbon fiber.

When the thermal expansion coefficient of the chassis base 112 is less than that of the panel 111, which could cause the front portion of the panel 111 to transform convexly, the thermal expansion coefficient of the camber suppression member 141 may be set to be less than that of the chassis base 112, thereby increasing the thermal expansion rate of the camber suppression member 141 smaller than that of the chassis base 112. Accordingly, convex cambering of the chassis base 112 may be prevented, thereby preventing cambering of the panel 111.

On the other hand, when the thermal expansion coefficient of the chassis base 112 is greater than that of the panel 111, which could cause the front portion of the panel 111 to transform concavely, the thermal expansion coefficient of the camber suppression member 141 may be set to be greater than that of the chassis base 112, thereby increasing the thermal expansion rate of the camber suppression member 141 larger than that of the chassis base. Accordingly, the concave cambering of the chassis base 112 may be prevented, thereby preventing cambering of the panel 111.

As described above, the first exemplary embodiment of the present invention may prevent panel damage and separation of the panel 111 and the chassis base 112. However, setting the thermal expansion coefficient of the camber suppression member 141 too high or low could potentially cause the panel 111 to warp in the opposite direction. Therefore, it may be desirable to set the thermal expansion coefficient of the camber suppression member 141 in a predetermined range to limit panel cambering.

The reinforcing member 121 may be installed on the rear surface of the chassis base 112 to reinforce the chassis base 112 and increase the chassis base's heat radiation efficiency by increasing its heat radiating area. The reinforcing members 121 may comprise side reinforcing members arranged on edges of the chassis base 112 in the longitudinal and transverse directions, and a central reinforcing member that is disposed on the center portion of the chassis base 112. The reinforcing member 121 may be manufactured using the same material as the chassis base 112, such as aluminum. Alternatively, it may be formed of steel material for stronger reinforcement.

When the reinforcing member 121 and the chassis base 112 are formed of the same material, their thermal expansion rates are nearly the same, thus the camber suppression member 141 may prevent panel cambering.

However, when the reinforcing member 121 and the chassis base 112 are manufactured using different material, such as with a steel reinforcing member 121 and an aluminum chassis base 112, the thermal expansion rate of the reinforcing member 121 may be less than that of the chassis base 112.

Therefore, the chassis base 112 may be inclined toward the reinforcing member 121, and its front portion may protrude convexly. Moreover, when the thermal expansion rate of the panel 111 is greater than that of the chassis base 112 and the front portion of the panel 111 protrudes convexly, the panel 111 cambering may be excessive.

In order to solve the above problems, the thermal expansion coefficient of the camber suppression member 141 may be set similarly to that of the reinforcing member 121. Specifically, assuming that the thermal expansion coefficients of the camber suppression member 141 and the reinforcing member 121 are a1 and a2, respectively, a relation between them may be set as $0.7 \leq a1/a2 \leq 1.3$.

The thermal expansion of the chassis base 112 may be restricted by the camber suppression member 141 and the reinforcing member having thermal coefficients satisfying the above relationship, thereby restraining the transformation of the front portion of the chassis base 112. Additionally, the camber suppression member 141 may be disposed corresponding to the position of the reinforcing member 121 so that they may effectively restrict the thermal expansion of the chassis base 112.

Figure 5:
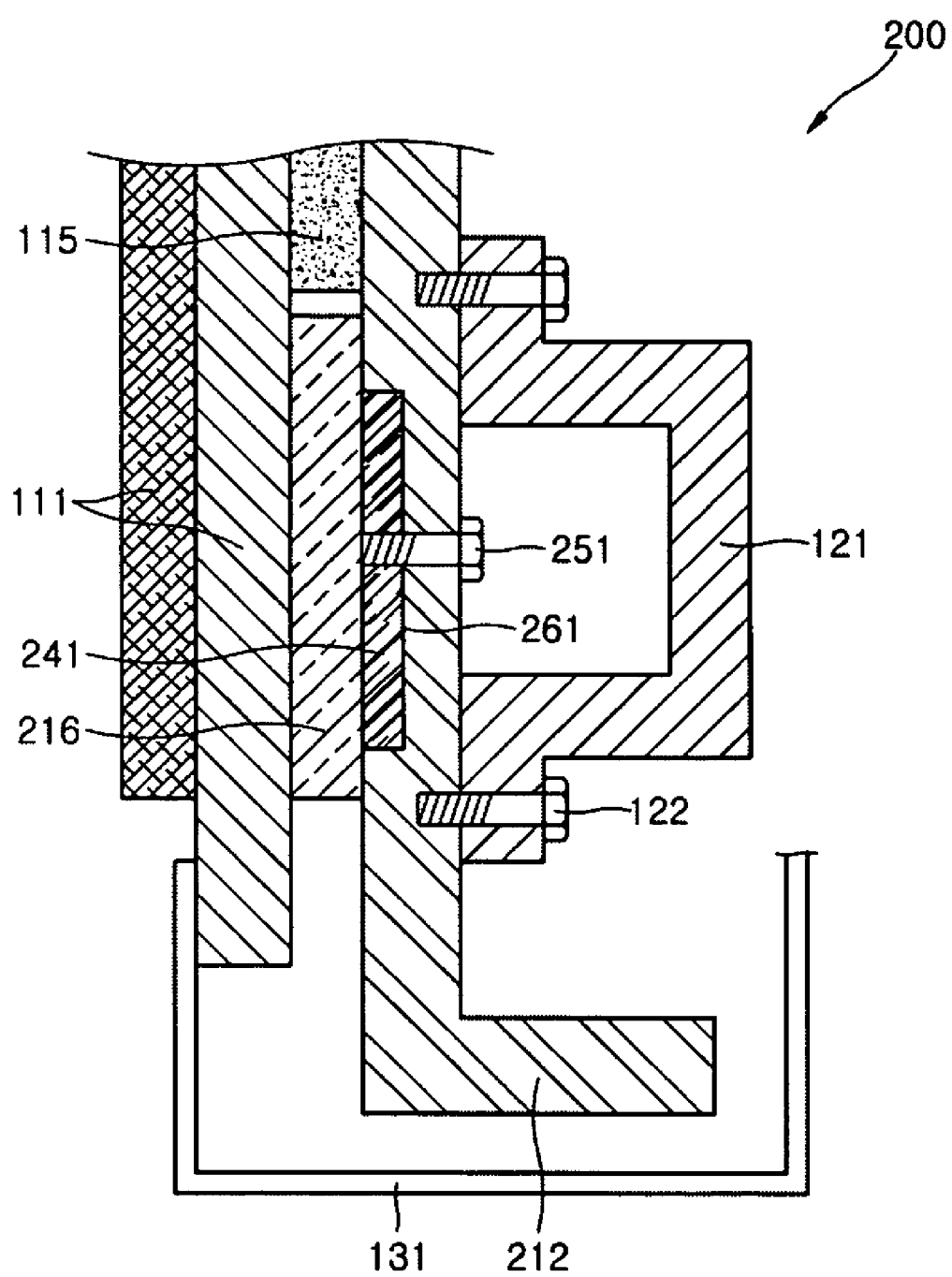
FIG. 5 is a cross-sectional view showing a plasma display apparatus according to a second exemplary embodiment of the present invention.
Figure 6:
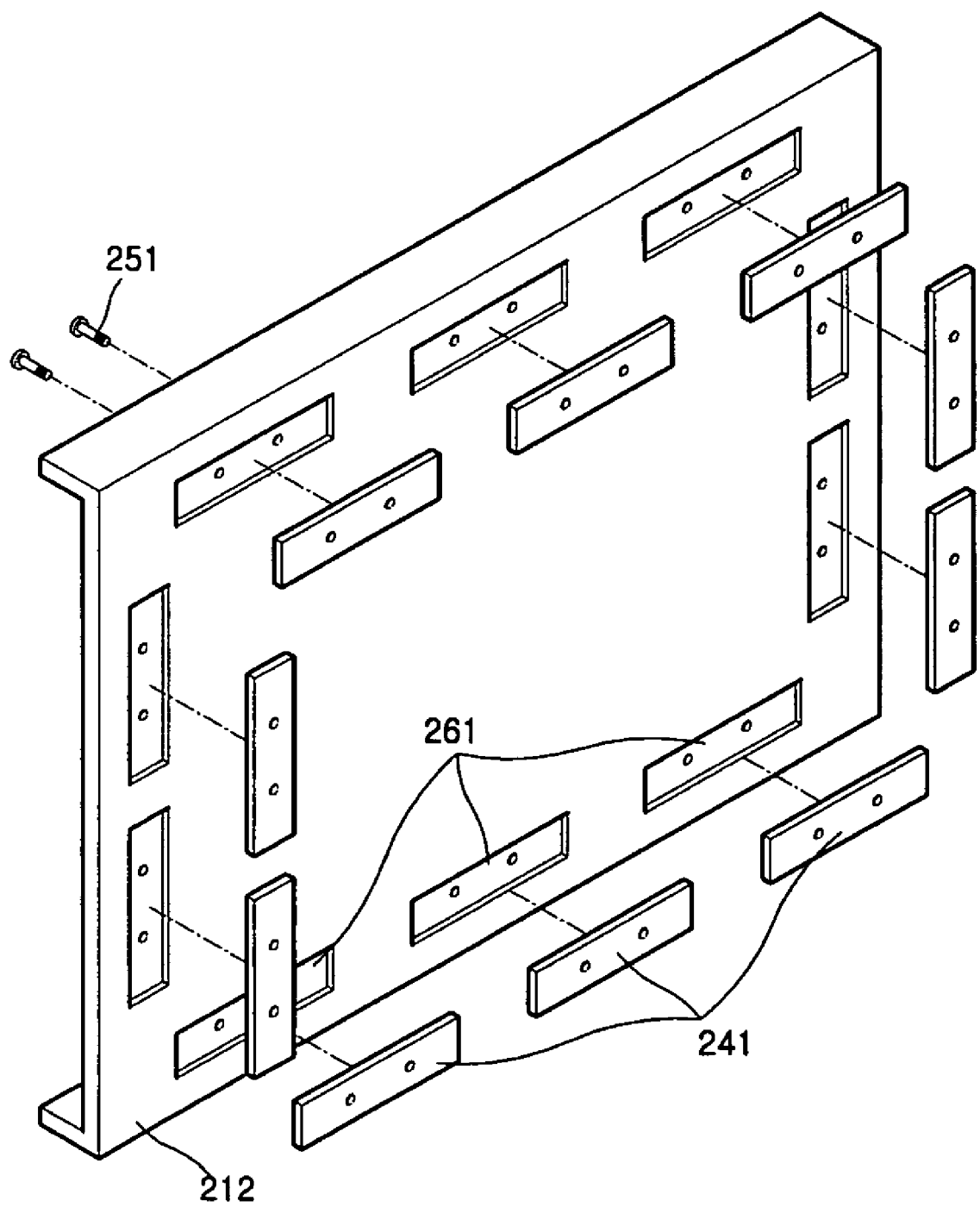
FIG. 6 is an exploded perspective view showing a chassis base and a camber suppression member installed on the chassis base of FIG. 5.

FIG. 5 is a cross-sectional view showing a plasma display panel according to a second exemplary embodiment of the present invention, and FIG. 6 is an exploded perspective view showing a camber suppression member installed on the chassis base of FIG. 5. Same reference numerals as those of the previous drawings denote the same elements, and detailed descriptions for those will be omitted.

Referring to FIG. 5, in the plasma display apparatus 200 according to the second exemplary embodiment, a camber suppression member 241 may be disposed between the panel 111 and the chassis base 212. The camber suppression member 241 may be inserted into an insertion recess 261, which is formed on the chassis base 212, and coupled to the chassis base 212 using a coupling unit, such as a screw 251. A dual adhesive tape 216 may couple the panel 111 and the camber suppression member 241. Like the first exemplary embodiment, the panel 111 and the chassis base 212 may be easily separated by removing the screws 251.

As shown in FIG. 6, the camber suppression member 241 may comprise a plurality of plate-shaped pieces, and the pieces of the camber suppression member 241 may be arranged on edges of the chassis base 212 in longitudinal and transverse directions. Additionally, the pieces of the camber suppression member 241 may be inserted and fixed into the insertion recesses 261 of corresponding shape. As described above, the camber suppression member 241 may be modified into various shapes, and an additional member may be disposed on a center portion between the panel 111 and the chassis base 212.

The camber suppression members 241 installed between the panel 111 and the chassis base 212 may restrict the thermal expansion of the chassis base 212 to prevent the panel 111 from bending, and the transformation of the panel may be compensated. Accordingly, the damage to the panel 111 may be prevented, and the panel 111 and the chassis base 212 may not separate.

As described in the first exemplary embodiment, appropriately setting the thermal expansion coefficient of the camber suppression member 241 according to the thermal expansion coefficient of the chassis base 212 may prevent excessive panel camber. Additionally, with a steel reinforcing member 121 and an aluminum chassis base 212, the thermal expansion coefficient of the camber suppression member 241 may be set similarly to that of the reinforcing member 121. The camber suppression member 241 may be disposed on a position corresponding to the position of the reinforcing member 121.

Figure 7:
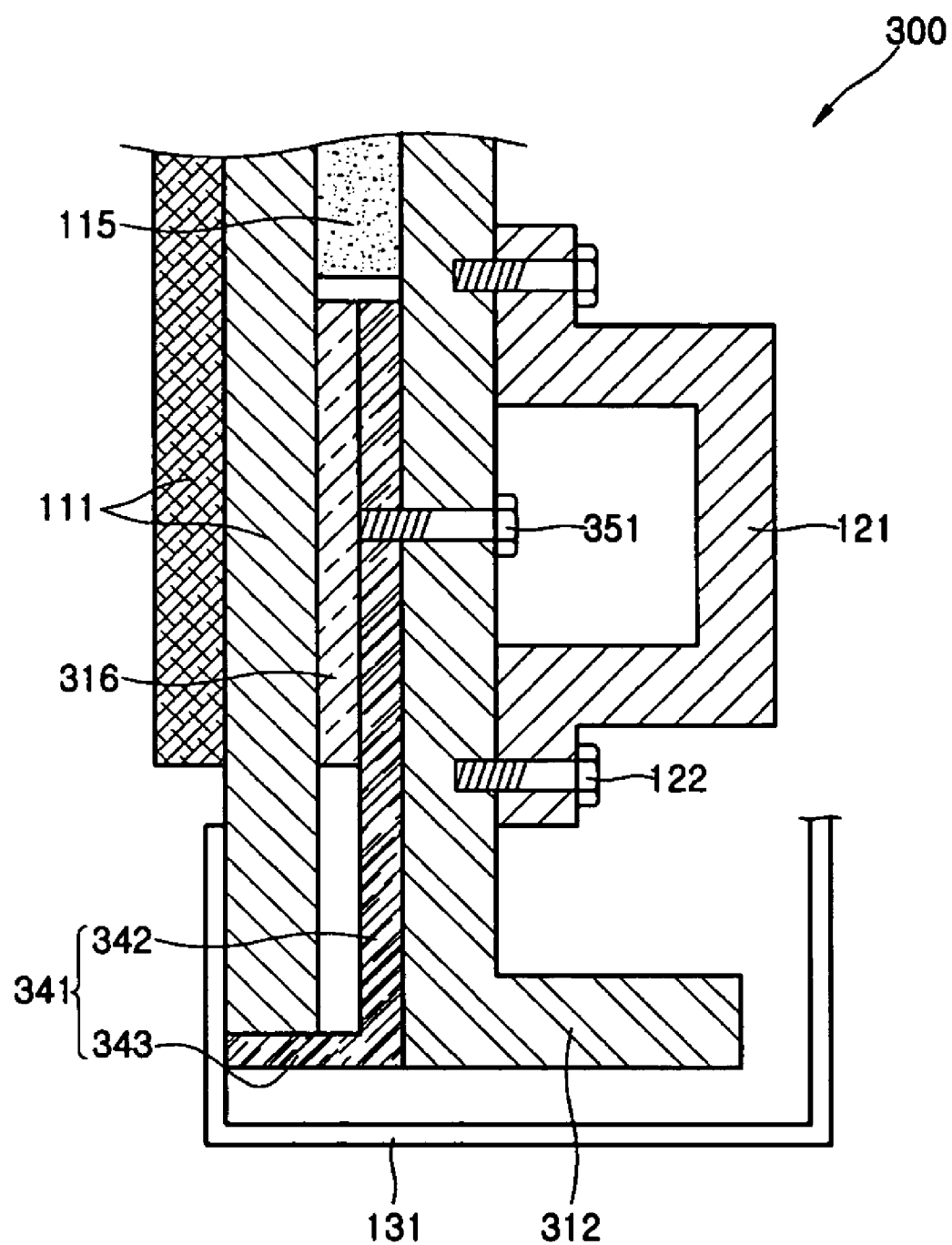
FIG. 7 is a cross-sectional view showing a plasma display apparatus according to a third exemplary embodiment of the present invention.
Figure 8:
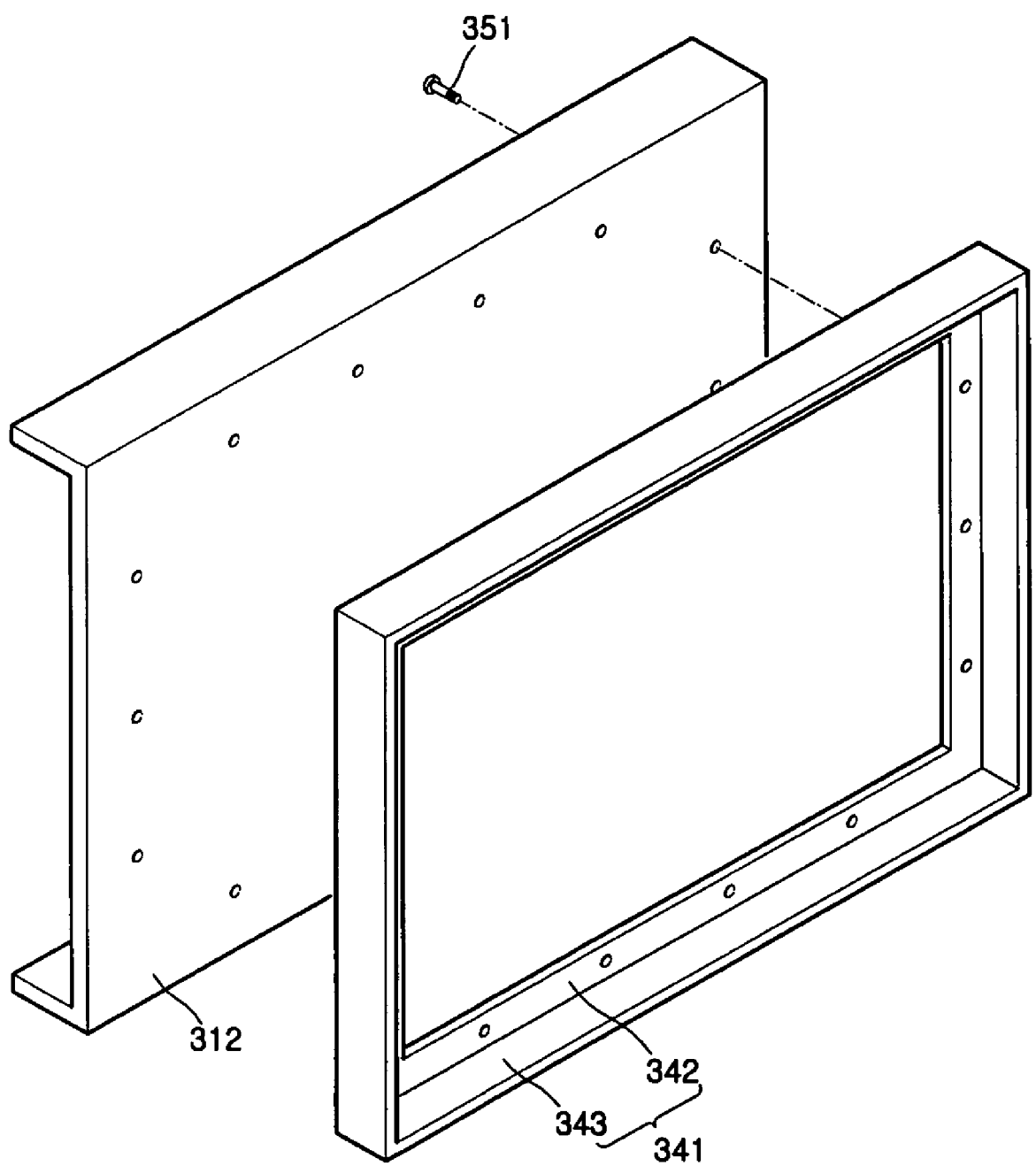
FIG. 8 is an exploded perspective view showing a chassis base and a camber suppression member installed on the chassis base in the apparatus of FIG. 7.

FIG. 7 is a cross-sectional view showing a plasma display apparatus according to a third exemplary embodiment of the present invention, and FIG. 8 is an exploded perspective view showing a camber suppression member installed on the chassis base in the apparatus of FIG. 7.

Referring to FIG. 7, in the plasma display apparatus 300 according to the third exemplary embodiment, a camber suppression member 341 may be disposed between the panel 111 and the chassis base 312. The camber suppression member 341 may be coupled to the chassis base 312 using a coupling unit, such as a screw 351. A dual adhesive tape 316 may couple the camber suppression member 341 to the panel 111. The panel 111 and the chassis base 312 may be easily separated from each other by removing the screws 351.

As shown in FIG. 8, the camber suppression member 341 may include a body portion 342 formed along the edge of the chassis base 312 and an extension portion 343 that is bent and extended toward the panel 111 from the body portion's outer edge.

The body portion 342 may be coupled to the chassis base 312, and the extension portion 343 may surround and protect the outer edge of the panel 111. The camber suppression member may be further disposed on a center portion between the panel and the chassis base.

As described above, the camber suppression member 341 may restrict the thermal expansion of the chassis base 312, thereby preventing panel cambering and compensating for the transformation of the plasma display apparatus. Accordingly, the panel damage due to cambering may be prevented, and the panel 111 and the chassis base 312 may not separate.

Additionally, as described in the above first and second exemplary embodiments, appropriately setting the thermal expansion coefficient of the camber suppression member 241 according to the thermal expansion coefficient of the chassis base 212 may prevent excessive panel camber. Also, with a steel reinforcing member 121 and an aluminum chassis base 312, the thermal expansion coefficient of the camber suppression member 341 may be set similarly to that of the reinforcing member 121. The camber suppression member 341 may be disposed on a position corresponding to that of the reinforcing member 121.

As described above, according to the plasma display apparatus of exemplary embodiments of the present invention, installing the camber suppression member between the panel and the chassis base may prevent panel cambering. Accordingly, damage to the panel may be prevented, and the panel and the chassis base may not separate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:
   a panel to display an image;
   a chassis base coupled to a rear surface the panel;
   a panel heat radiation unit between the panel and the chassis base; and
   a camber suppression member spaced apart from the panel heat radiation unit and disposed between the rear surface of the panel and the chassis base to prevent the panel from being cambered, wherein the camber suppression member is continuously formed on an edge of a side surface of the panel and an edge of the chassis base, and the rear surface of the panel and the side surface of the panel are different surfaces of the panel.

2. The plasma display apparatus of claim 1, further comprising a camber suppression member at a center portion of the panel.

3. The plasma display apparatus of claim 1, wherein an extension portion that is bent toward the panel so as to surround an end portion of the panel is formed on a side of the camber suppression member.

4. The plasma display apparatus of claim 1, wherein a screw couples the camber suppression member to the chassis base.

5. The plasma display apparatus of claim 1, further comprising a reinforcing member coupled to the chassis base.

6. The plasma display apparatus of claim 5, wherein the chassis base and the reinforcing member are made of an aluminum material.

7. The plasma display apparatus of claim 5, wherein $0.7 \leq a1/a2 \leq 1.3$;
wherein a1 is a thermal expansion coefficient of the camber suppression member; and wherein a2 is a thermal expansion coefficient of the reinforcing member.

8. The plasma display apparatus of claim 5, wherein the chassis base is made of an aluminum material and the reinforcing member is made of a steel material.

9. The plasma display apparatus of claim 8, wherein $0.7 \leq a1/a2 \leq 1.3$;
wherein a1 is a thermal expansion coefficient of the camber suppression member; and wherein a2 is a thermal expansion coefficient of the reinforcing member.

10. The plasma display apparatus of claim 5, wherein the reinforcing member includes side reinforcing members formed on edges of the chassis base in a longitudinal direction and a transverse direction.

11. The plasma display apparatus of claim 10, wherein the reinforcing member includes a center reinforcing member on a center portion of the chassis base.

12. The plasma display apparatus of claim 11, wherein the plates are arranged on positions corresponding to those of reinforcing members.

* * * * *

UNITED STATES PATENT AND TRADEMARK OFFICE
CERTIFICATE OF CORRECTION

| | | |
|---|---|---|
| PATENT NO. | : 7,629,748 B2 | Page 1 of 1 |
| APPLICATION NO. | : 11/036046 | |
| DATED | : December 8, 2009 | |
| INVENTOR(S) | : Sok-San Kim | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1250 days.

Signed and Sealed this

Second Day of November, 2010

David J. Kappos
*Director of the United States Patent and Trademark Office*